United States Patent [19]

Eng

[11] Patent Number: 4,847,675
[45] Date of Patent: Jul. 11, 1989

[54] STABLE RARE-EARTH ALLOY GRADED JUNCTION CONTACT DEVICES USING III-V TYPE SUBSTRATES

[75] Inventor: Genghmun Eng, Torrance, Calif.

[73] Assignee: The Aerospace Corporation, El Segundo, Calif.

[21] Appl. No.: 48,103

[22] Filed: May 7, 1987

[51] Int. Cl.$^4$ ............................................ H01L 23/48
[52] U.S. Cl. ........................................ 357/71; 357/67; 357/65; 357/63
[58] Field of Search ........................ 357/67, 65, 71, 63

[56] References Cited

U.S. PATENT DOCUMENTS

| | | | |
|---|---|---|---|
| 4,017,890 | 4/1977 | Howard et al. | 357/67 |
| 4,141,020 | 2/1979 | Howard et al. | 357/67 X R |
| 4,154,874 | 5/1979 | Howard et al. | 437/197 |
| 4,201,999 | 5/1980 | Howard et al. | 357/65 X R |
| 4,593,307 | 6/1986 | Rupprecht et al. | 357/67 R |
| 4,695,869 | 9/1987 | Inoue et al. | 357/67 R |

OTHER PUBLICATIONS

Ho et al, "Rare Earth Additions to Gold Metallurgy for High-Current Metallurgy Density Operations," *IBM Technical Disclosure Bulletin*, vol. 20, No. 11A, Apr. 1978, pp. 4631-4632.
Howard, "Fabrication of Ultra-Low Barrier Height SBD Structures Using Rare Earth Transition Metal Alloys," *IBM Technical Disclosure Bulletin*, vol. 23, No. 8, Jan. 1981, pp. 3681-3682.
Howard et al, "Rare-Earth-Aluminum Intermetallic Compounds for Electromigration Improvement of Micron or Submicron Conductor Lines," *IBM Technical Disclosure Bulletin*, vol. 20, No. 6, Nov. 1977, pp. 2241-2242.
"Ohmic Contacts to Lightly Doped Silicon Using Rare Earth Metals" by J. K. Howard [IBM Tech. Discl. Bull. 25(4), 1922-1925 (1982)].
"Gate for MOS Devices: Rare Earth Silicides" by J. K. Howard [IBM Tech. Disc. Bull. 21(7), 2811-2812 (1978)].

*Primary Examiner*—Andrew J. James
*Assistant Examiner*—William A. Mintel
*Attorney, Agent, or Firm*—William J. Burke

[57] ABSTRACT

A coating is disclosed for use with GaAs and other Type III-V semiconductor substrates, comprised of a rare-earth element or elements and a non-rare-earth element or elements, that forms an improved graded junction which is thermally stable, has satisfactory electrical properties and is resistant to the through migration of Ga or As.

8 Claims, 7 Drawing Sheets

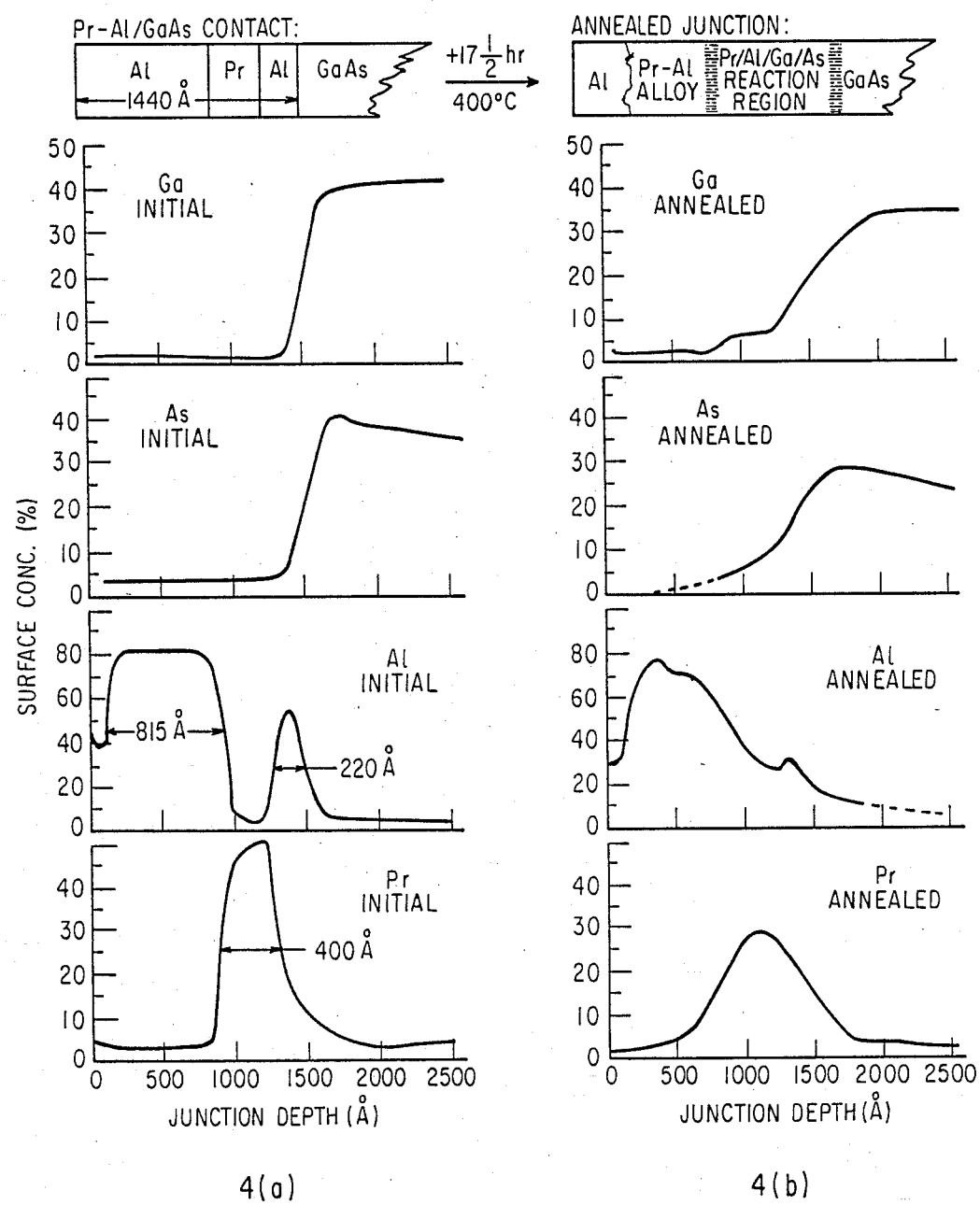
4(a)      4(b)

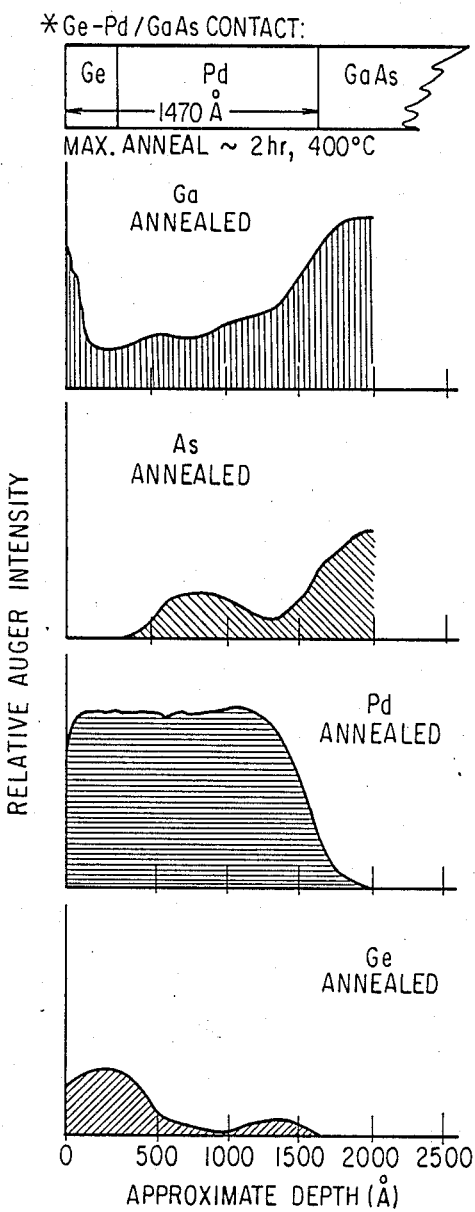
4(c)

STABLE RARE-EARTH ALLOY GRADED JUNCTION CONTACT DEVICES USING III-V TYPE SUBSTRATES

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

The present invention relates to GaAs and other III-V type semiconductor devices and methods of fabrication thereof. More particularly, the invention relates to the incorporation of a stabilizing layer on a III-V type substrate.

2. Description of the Prior Art

The prior art discloses the desirability of placing a coating on a semiconductor substrate in order to improve the thermal and electrical properties of the semiconductor device.

For silicon substrates, it is well-known that a metallization layer composed of one or more elements can provide either a Schottky barrier or ohmic contacts, depending on the components used for the metallization layer. Many of these metallization layers have the requisite amount of thermal and electrical stability needed for useful commercial applications when used with a silicon substrate.

Several types of coatings, both single metal and alloys, have been proposed for use with a substrate composed of III-V type elements, like gallium arsenide (GaAs). However, many of the prior art metallization layers which had been used with silicon substrates, have been shown to be unsuited for use with a substrate composed of a compound of Type III and Type V elements, like Gallium-Arsenide (GaAs), by virtue of being chemically unstable when abutting the III-V type substrate.

In such cases, a chemical instability causes the metallization coating to preferentially react either with the Ga or As. This reaction causes large regions containing excess Ga or excess As to form within the junction. In the worst case, the Ga component migrates through the entire coating to the contact surface where gallium oxide can form. The gallium oxide causes nonuniformities in the device and results in unstable electrical properties. The degradation in the GaAs device is increased over time and as the device is stressed.

Metal coatings predominantly comprised of a single metal abutting GaAs which have been examined include the following, each showing the formation of a Ga-rich phase and migration of that Ga-rich phase through the entire junction: (a) Pt on GaAs ["Reaction of Sputtered Pt Films on GaAs" by V. Kumar, J. Phys. Chem. Solids 36, 535–541 (1975); "The Effects of Surface Treatments on the Pt/n-GaAs Schottky Interface" by A. Aydinli and R. J. Mattauch, Solid-State Electron. 25(7), 551–558 (1982)]; (b) Pd and Ge-Pd on GaAs ["Metallurgical and Electrical Characterization of Metal-Semiconductor Contacts" by G. Y. Robinson, Thin Solid Films 72, 129–141 (1980); "Interaction of Evaporated Palladium Thin Films with GaAs" by A. Oustry, M. Caumont, A. Escaut, A. Martinez, and B. Toprasertpong, Thin Solid Films 79, 251–256 (1981)]; (c) the In and In-Pt on GaAs systems ["The Effect of the Metallurgical Properties of the In-GaAs Interface on the Electrical Properties of Ohmic Contacts to GaAs" by A. K. Kulkarni and T. J. Blankinship, Thin Solid Films 96, 285–290 (1982); "In/Pt Ohmic Contacts to GaAs" by D. C. Marvin, N. A. Ives, and M. S. Leung, J. Appl. Phys. 58(7), 2659–2661 (1985)]; and (d) Au on GaAs ["Disassociation of GaAs and $Ga_{0.7}Al_{0.3}As$ during Alloying of Gold Contact Films" by E. Kinsbron, P. K. Gallagher, and A. T. English, Solid-State Electron. 22, 51–524 (1979); "Electron Microscope Study of Alloying Behavior of Au on GaAs" by K. Kumar, Jpn. J. Appl. Phys. 18, 713–716 (1979)].

Alloys which have been studied include the following, each showing the formation of a Ga-rich phase and migration of that Ga-rich phase through the entire junction: (a) the extensively studied Au-Ge and Au/Ni-Ge on GaAs contact systems ["Metallurgical and Electrical Properties of Alloyed Ni/Au-Ge Films on n-Type GaAs" by G. Y. Robinson, Solid-State Electron. 18, 331–342 (1975); "Contact Degradation of GaAs Transferred Electron Devices" by C. J. Palmstrom, D. V. Morgan, M. J. Howles, Nucl. Instrum. and Meth. 150, 305–311 (1978); "Alloying Behavior of Ni/Au-Ge Films on GaAs" by M. Ogawa, J. Appl. Phys 51(11), 406–412 (1980); "Ohmic Contacts to n-GaAs Using Low Temperature Anneal" by J. G. Werthen and D. R. Scifres, J. Appl. Phys 52(2) 1127–1129 (1981); "Characteristics of AuGeNi Ohmic Contacts to GaAs" by M. Heiblum, M. I. Nathan, and C. A. Chang, Solid-State Electron. 25(3), 185–195 (1981); "Metallurgical Behavior of Ni/Au-Ge Ohmic Contacts of GaAs" by A. Iliadis and K. E. Singer, Solid-State Commun. 49(1), 99–101 (1984)]; (b) the Au/Ni-Sn on GaAs system ["Au/ Ni/ SnNi/ n-GaAs Interface: Ohmic contact Formation" by Aydinli and R. J. Mattauch, J. Electrochem. Soc. 128 (12), 2635–2638 (1981)]; and (c) the Au/In-Ge on GaAs system ["Metallurgical Reactions in Au/(In-Ge) Ohmic Contacts to GaAs" by C. R. M. Grovenor, Thin Solid Films 104, 409–418 (1980)].

While the above mentioned prior work teaches the desirability of producing a coating on a III-V type substrate which can be resistant to migration of either substrate constituent through the coating, that body of work does not teach how to select coating components to effect the migration resistance, so as to improve the thermal and electrical properties of the semiconductor device.

As is disclosed herein, the inventors have found that the inclusion of a rare-earth element as a component of the coating can effect a migration resistance for coatings abutting a III-V type substrate.

The inventors have found that a stable coating for a Type III-V substrate can be fabricated by using an alloy which includes both rare-earth and a non-rare-earth components selects so as to form high melting point intermetallics with both the anion and cation components of a III-V type substrate.

Moreover, dopants and surface wetting agents can be added to the compound to tailor electronic properties. In addition, a cover layer can be added to abut the top of the coatings so as to increase the resistance of the coating to either exposure or to better allow other layers to be fabricated on top of the coating.

Accordingly, it is an object of the present invention to provide a coating for use with GaAs or other III-V type semiconductor substrates, which results in an improved graded junction contact with the substrate, and which exhibits high thermal stability and satisfactory electrical properties.

It is also an object of this invention to create a graded junction contact to a III-V type substrate which can become resistant to through migration of Ga or As.

It is yet another object of this invention to provide a junction which becomes more stable over time.

A further object of this invention is to provide a coating for a GaAs which allows for the addition to dopants or surface wetting agents to the substantial coating components to further modify or control the electronic properties of the system.

It is another object of this invention to provide an effective coating for other types of III-V type substrates in addition to GaAs.

SUMMARY OF THE INVENTION

A coating for a GaAs or other III-V type substrate is disclosed that is essentially comprised of a component consisting of a rare-earth element or combination of rare-earth elements and another component comprised of a non-rare-earth element or elements which form semiconducting or intermetallic compounds with As. Other components such as dopants or wetting agents can be added to the coating to further tailor the electronic properties and to improve surface uniformity in semiconductor systems. In addition, a cover layer can be added to increase the resistance of the coating to either exposure or to better allow other layers to be fabricated on top of the coating.

BRIEF DESCRIPTION OF THE DRAWINGS

The objects, features, and advantages of the present invention will become apparent from the following detailed description of the invention, including the detailed preferred and exemplary embodiments, taken in conjunction with the accompanying drawings labeled FIGS. 1–7 where:

FIGS. 4a–4c are graphs illustrating the improved graded junction stoichiometry that results from the invention.

DETAILED DESCRIPTION OF THE INVENTION

Figure 1A:
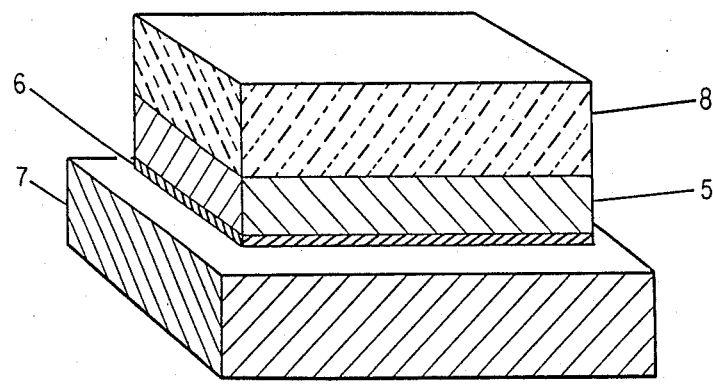
FIGS. 1a and 1b are schematic sectional views of two types of fabricated junction contacts to a III-V type substrate prior to either a deliberate thermal annealing step or device operation to perfect the graded junction contact structure abutting the III-V type substrate.

FIG. 1a shows the initial structure of a device fabricated according to the present invention before annealing. Substrate 7 is made up of Type III and Type V elements. Alloy layer 5 is made up of an intermetallic alloy substantially comprised of at least two components. The first component is a rare earth element or a combination of rare-earths. The second component is a non-rare-earth element or alloy. Other components that may be added to alloy layer 5 include dopants and surface wetting agents, or these components may be applied as a separate layer 6. A cover layer 8 may be used to protect the coating components.

Figure 1B:
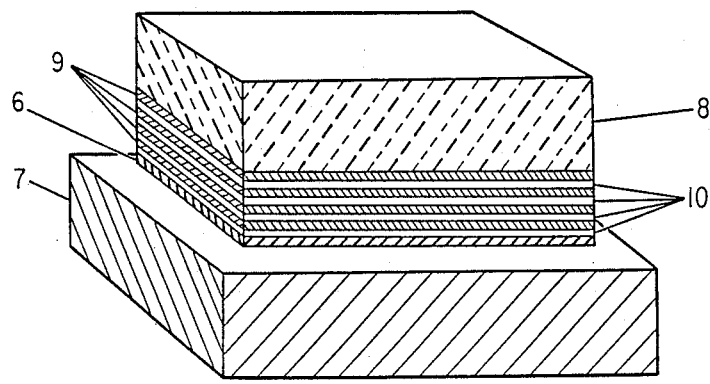

FIG. 1b shows an alternative embodiment where the rare-earth component 10 and the non-rare earth component 9 are applied as separate layers. The separate layers mix together during annealing. Both components form high melting point intermetallics with both the anion and cation components of a III-V type substrate. For example, in a GaAs substrate, the rare-earth combines with the gallium to form a high melting point, thermally stable, Ga-rich intermetallic phase between the rare-earth and gallium. And the non-rare-earth elements or alloys, like the aluminum-indium alloy system, form semiconducting or intermetallic compounds with As.

Figure 2:
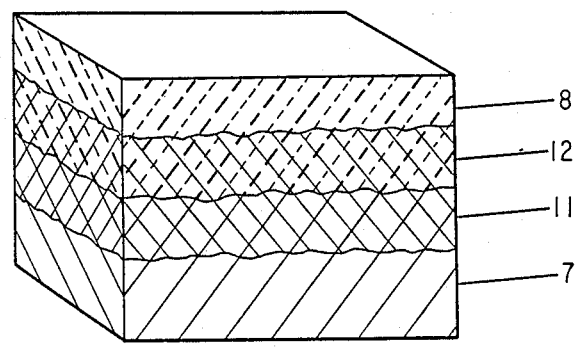
FIG. 2 is a schematic sectional view of a graded junction contact to a III-V type substrate after a deliberate thermal annealing step or device operation has been performed so as to perfect a graded junction contact structure abutting the III-V type substrate.

The device is then annealed in either a vacuum or in an inert atmosphere. FIG. 2 shows the graded junction structure of the device 1 after annealing. Layer 11 consists of rare-earth type III intermetallics, type V compounds and contact intermetallics. Layer 12 consists of materials formed by the interaction of the alloy layer 5 with the cover layer 8. Layer 8 consists of unreacted materials in the cover layer.

There are several preferred methods for forming the graded junction of the present invention. Three methods for forming the graded junction may be described with reference to FIG. 3.

In Step 1, the III-V type substrates are loaded into a standard evaporator or sputter system and the system is evacuated down to a pressure below $1 \times 10^{-6}$ Torr.

In Step 2, the component materials for the rare earth alloy contact are deposited on the substrate using standard evaporator or sputtering deposition methods.

As part of Step 2, the contact materials can be deposited in a single layer as shown in FIG. 1 or they can be deposited in separate layers as shown in FIG. 1b. Also as part of Step 2, deliberate dopants or surface wetting promotion agents can be deposited in very thin layers, preferably less than 100 Angstroms.

In Step 3, a cover layer is then deposited. The cover layer should preferably be at least 500–1000 Angstroms thick.

In Step 4 the graded junction is then perfected either by annealing or by operation of the device. The annealing temperature should be adjusted depending on the specific rare earth alloy composition. For example, a rare earth aluminum alloy is annealed by heating to a temperature between 250° C. and 500° C. A rare earth indium alloy is annealed by heating to a temperature between 100° and 400° C.

As an alternative to annealing, a graded junction can be formed by applying suitable currents and voltages. Once formed, the graded junction can become more stable with continued operation and better resists Ga or As through migration.

EXEMPLARY EMBODIMENTS OF THE INVENTION

For evaluation of the rare-earth based alloy contact metallization systems for application to III-V type substrates, several contacts were fabricated on GaAs using an electron-beam evaporator deposition method, and using Pr-Al and Pr-In alloys, along with an Al-cover layer. Although each study set forth in detail below forms an exemplary embodiment of this invention, they are offered merely for the purposes of illustration and are not intended to limit the scope of the invention.

These exemplary embodiments show that layers or alloys of praseodymium-aluminum or of praseodymium-indium, which abut a GaAs semiconductor surface, when covered with a layer of Al and after a suitable thermal treatment, each exhibit an improved graded junction contact with GaAs. The improved graded junction contact exhibits an increased thermal stability compared to prior art, and exhibits an improved As/Ga ratio within the graded junction region by virtue of being closer to unity compared to prior art. Extensions to other rare-earth alloy systems are validated on the basis of published studies showing a similar intermetallic phase formation among the Pr-Ga and other rare-earth/Ga systems.

EXAMPLE 1

Figure 3:
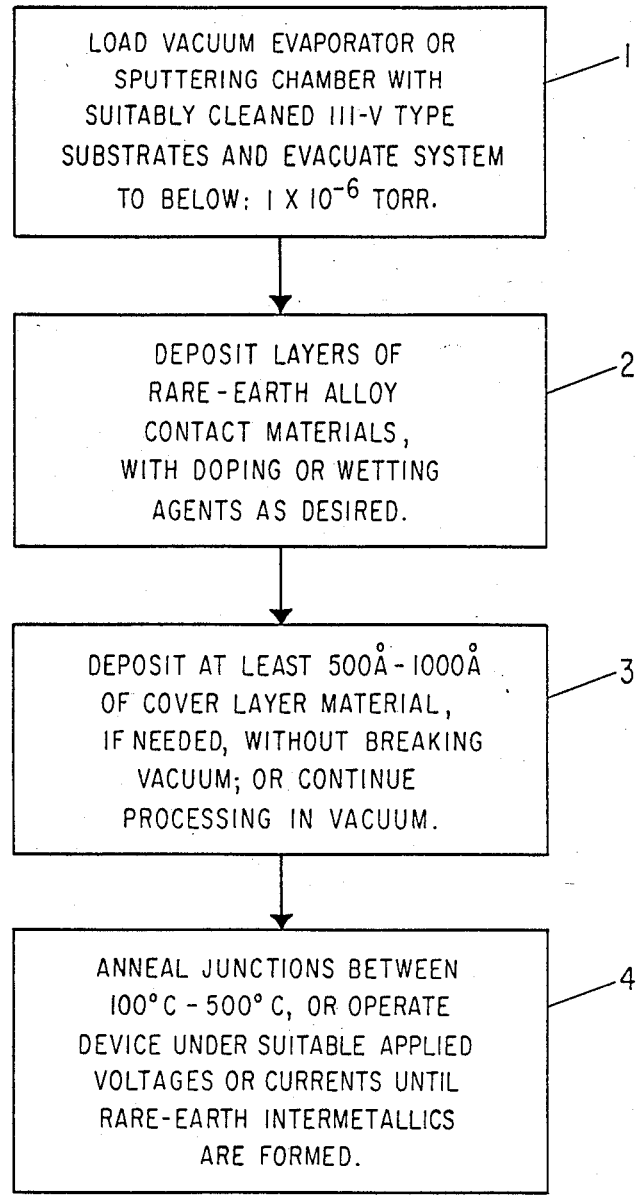
FIG. 3 is a flow diagram representing one preferred method for forming a wide-area graded junction contact to a III-V type substrate that is designed in accordance to the invention; with other intermediate steps allowed as needed, to perfect smaller junction structures.

In this evaluation of the rare-earth based alloy contact metallization system for application to III-V type substrates, Pr-Al contacts were fabricated onto a GaAs substrate as shown in FIG. 1b, using an evaporation method as outlined in FIG. 3. The deposition system was comprised of a multiple hearth shuttered electron-beam evaporator and high purity Pr and Al materials were used.

An initial Al layer of about 220 Angstroms in thickness was first evaporated abutting a suitably cleaned GaAs substrate. An evaporation step with a closed shutter was then done using Ti, to help getter residual oxygen, minimizing the possibility of contamination by ambient. About 400 Angstroms of Pr was then deposited, followed by a second Al evaporation to create the unannealed multi-layer structure. This final Al deposition was continued up to a layer thickness of about 815 Angstroms. This final Al deposition also functions as a cover layer.

The stability of the contact prepared according to the present invention was then determined. Contacts were annealed in vacuum ($<10^{-8}$ Torr), at 400° C. for periods of up to 17.5 hours, representing a long high-temperature stress for contact devices.

Auger electron spectroscopy (AES) along with Ar-ion depth profiling was used to evaluate the contact interdiffusion rates, as is well known in the prior art. Tabulated Auger electron spectroscopy date [P. W. Palmberg, G. E. Riach, R. E. Weber, and N. C. Mac-Donald, *Handbook for Auger Electron Spectroscopy* (Physical Electronics Industries, 1972)] was used to convert the AES signals to estimated surface percent.

Results are shown in FIG. 4 for the majority contact elements: Pr, Al, Ga, and As, both prior to annealing (FIG. 4a), and post-annealing (FIG. 4b), with the sketches at the top of FIGS. 4a and 4b showing the overall contact configuration. The two Al layers have diffused together, forming a rare-earth alloy region with the Pr layer, which then abuts the GaAs substrate. This alloy abutting the GaAs substrate is also shown to form a graded junction region that is comprised of a combination of the rare-earth alloy materials and the Ga and As substrate materials. It is important to note the absence of substantial penetration of the Ga and As substrate materials into the contact alloy. Neither the Ga nor the As has succeeded in migrating in any substantial amount through the alloy coating.

The rare-earth alloy contact results int FIG. 4a and FIG. 4b, using an initial pre-anneal contact thickness of about 1440 Angstroms, are compared to some previously published results shown in FIG. 4c, on the Ge-Pd/GaAs contact system by G. Y. Robinson [Thin Solid Films, 72, 129 (1980)]. Both the rare-earth alloy and the Ge-Pd systems used similar annealing temperatures of about 400° C. In addition, both contacts were of the same approximate total thickness, with the rare-earth alloy contact being annealed for nearly 10 times longer, which represents a significant net additional stress on the rare-earth alloy to GaAs system. Yet, FIG. 4 shows less Ga and As migration through the rare-earth alloy contact, thus demonstrating the improvement that can be obtained using graded junction device comprised of the rare-earth alloy contact on a III-V type substrate.

EXAMPLE 2

Figure 5:
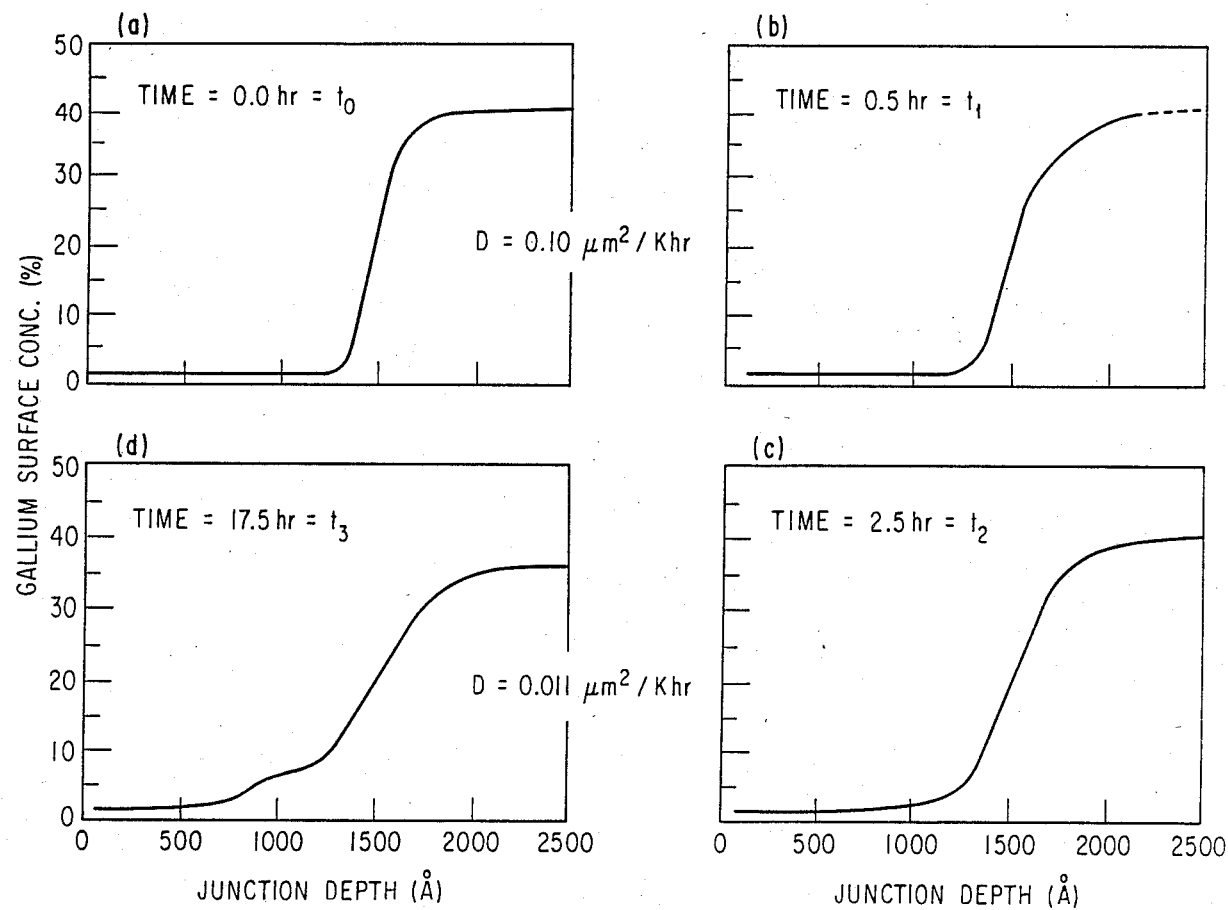
FIGS. 5a–5d are graphs illustrating the improved thermal stability that results from the device, whereby the graded junction contact becomes an increasingly effective barrier against migration of the substrate components through the contact materials with increasing time of device operation.

The rare-earth alloy contact abutting the III-V type substrate not only results in an improved junction stoichiometry compared to prior art, it also decreases transport of substrate materials through the contact with continuing contact use, as demonstrated in this example. Using the fabrication methods as outlined in Example 1, Pr-Al contact materials are initially abutting a III-V type GaAs substrate. The contacts were then annealed in vacuum ($<10^{-8}$ Torr) at 400° C. for several different annealing times: 0.5 h., 2.5 h., and 17.5 h. Applying standard methods of analysis [J. R. Crank, *Mathematics of Diffusion*, Second Edition (Clarendon Press, Oxford, 1975)], along with the unannealed junction results of FIG. 4, an estimate for the Ga diffusivity was determined from each pair of annealing times. As shown in FIG. 5, the diffusivity decreasing by nearly an order of magnitude between the initial and final anneals. Those results demonstrate that the junction based on the rare-earth alloys becomes a more effective migration barrier with continuing usage.

EXAMPLE 3

Figure 6:
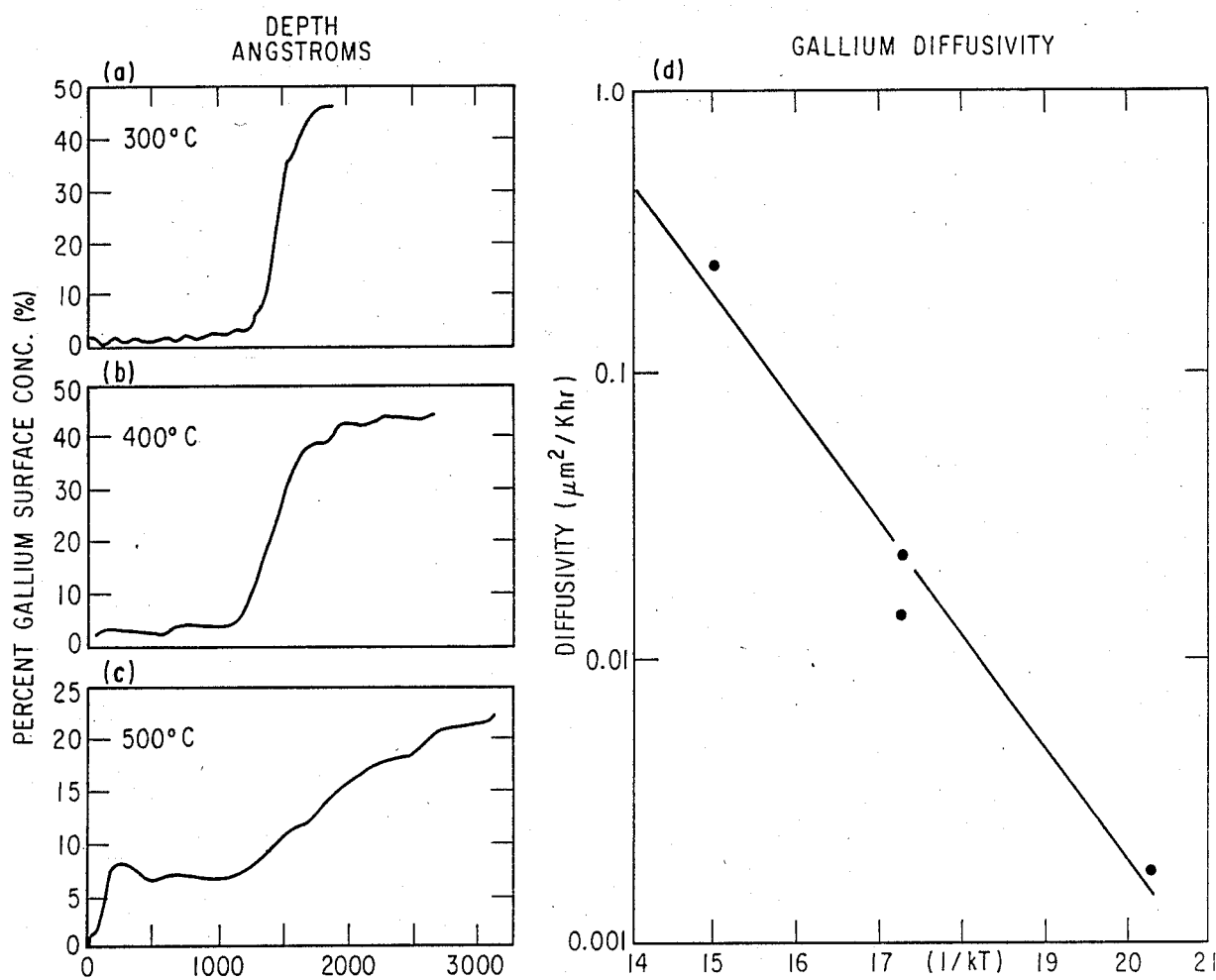
FIGS. 6a–6d are graphs illustrating the width of the graded junction region as a function of temperature.

Junctions of a specified depth can be constructed, given a particular time and temperature treatment. In FIG. 6, the results of such an annealing temperature study are shown. In the study, rare-earth alloy contacts are fabricated as given in Example 1, while using different annealing temperatures and holding the annealing time constant.

Annealing for these samples was performed using a flowing argon oven facility at atmospheric pressure, so as to minimize contact oxidation. These results, taken along with the vacuum annealed results of Examples 1 and 2, show that the annealing step requires only a chemically inert atmosphere. In addition, this temperature study shows an activation energy for the diffusivity of about 0.93 eV, which is consistent with the prior art for a diffusion mechanism that is controlled by grain-boundary type defects, as is expected in thin film transport. The observed thermal stability shown in FIG. 6 then allows the width of the graded junction region to be controlled over a wide range of temperature.

EXAMPLE 4

Figure 7:
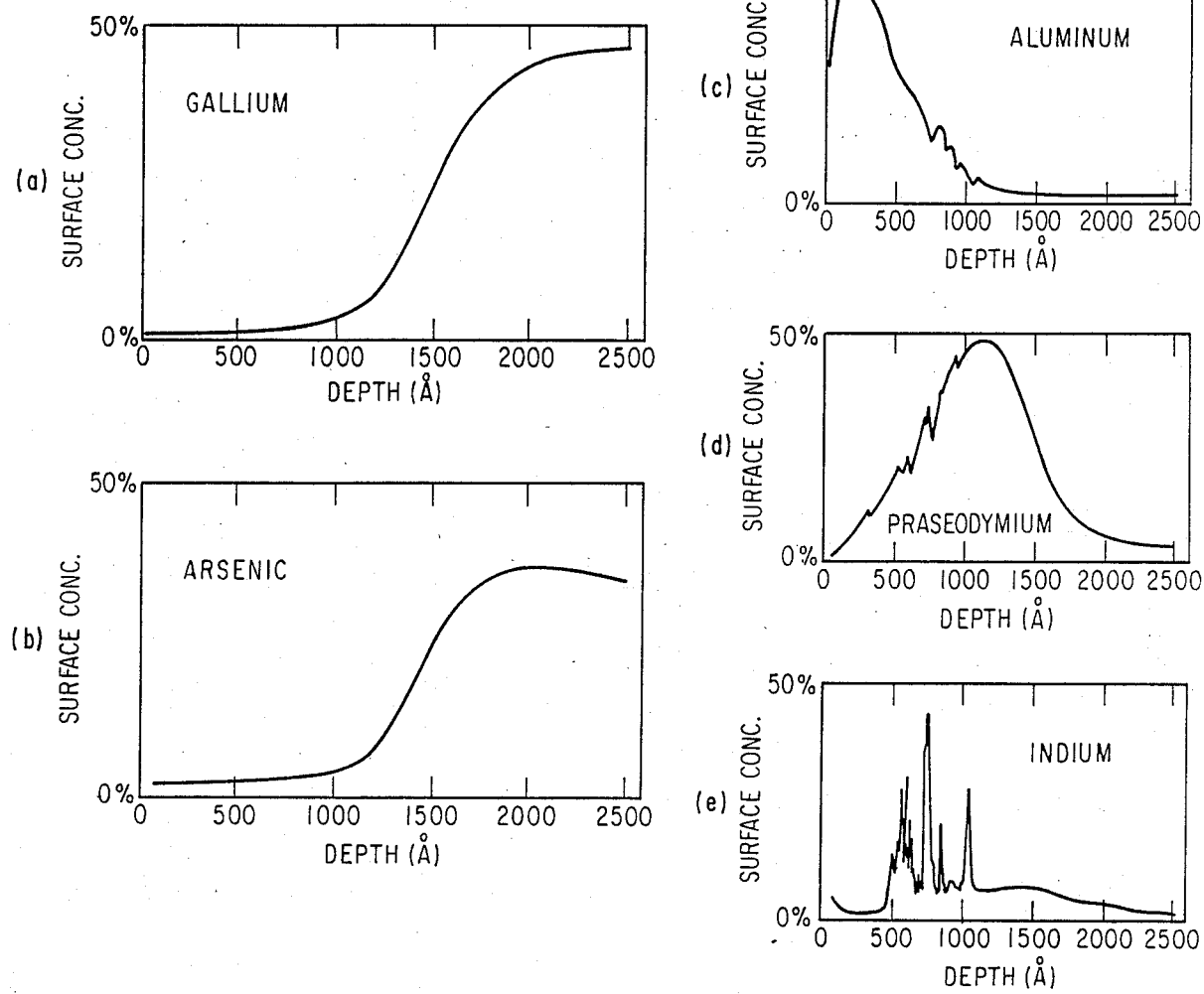
FIGS. 7a–7e are graphs illustrating the use of rare earth alloys with metals other than aluminum.

FIG. 7 shows the results of a study demonstrating that the rare-earth alloy contact to a III-V substrate junction device allows other alloying materials besides aluminum to be used in conjunction with the rare-earth component.

Unalloyed layers of In and Pr were first deposited onto a cleaned GaAs substrate, using electron-beam evaporation methods similar to the fabrication methods outlined in Example 1. These contacts were then overlaid with a cover layer of Al, to minimize contact exposure to ambient during the annealing stages.

These contacts were annealed at 300° C. for 17.5 hours. AES and argon ion depth profiling indicate that a graded Ga and As junction region has formed, as shown in FIGS. 7a, and 7b. FIG. 7c shows that the aluminum cover layer has not even penetrated to substantially mix with either the Ga or As components. The Pr and In layers, initially sandwiched in between the Al cover layer and the GaAs surface, are shown in FIGS. 7d and 7e respectively.

During the AES analysis, some of the indium was seen to evaporate, as evidenced by the jagged swings observed in the indium depth profile. In addition, a fraction of the indium has also penetrated deep into the GaAs substrate, as commonly seen in contacts on GaAs which contain indium. However, using the Pr results as an overall indication of the Pr-In alloy region, FIG. 7 demonstrates that the rare-earth alloy contact has succeeded in halting both the Ga and the As migration to the upper surface, similar to the Pr-Al alloy contact results. And, as with the Pr-Al alloy contact results, the Ga and As stoichiometry within the graded junction region is also closer to the bulk substrate value, compared with prior art. These results establish that the rare-earth alloy contact can be used with III-V type substrates to create stable graded junction devices.

EXAMPLE 5

To estimate the effect of substitution of other rare-earths for Pr in a rare-earth alloy junction contact, we calculated a stability index for each, based on the ratio of the melting point of the Ga-richest intermetallic, compared to $PrGa_2$, using published phase diagrams for the other rare-earth/Ga alloys ["Phase Diagrams of Rare Earth Metals with Gallium" by S. P. Yatsenko, A. A. Semyannikov, B. G. Semenov and K. A. Chuntonov, J. Less Common Metals 64, 185-199 (1979)]. It results in the following stability index values, for each Ga-richest phase:

$0.75(ScGa_3)$, $0.93(YGa_2)$, $0.99(LaGa_2)$, $0.99(CeGa_2)$, $0.99(NdGa_2)$, $0.95(SmGa_2)$, $0.71(EuGa_4)$, $0.96(GdGa_2)$, $0.95(TbGa_2)$, $0.62(DyGa_3)$, $0.66(HoGa_3)$, $0.71(ErGa_3)$, $0.71(TmGa_3)$, $0.61(YbGa_4)$, $0.69(LuGa_3)$.

These values are relative to $PrGa_2$ having a stability index of 1.00. These results show that the group of rare-earth alloy graded junction contacts on III-V type substrate materials should form a similar and coherent class of distinct devices.

While the preferred embodiment of the present invention has been illustrated and described, it is to be understood that the invention is not limited to the precise construction disclosed herein and the right is reserved to all changes and modifications coming within the scope of the invention as defined in the appended claims.

I claim:

1. A semiconductor device with a graded junction comprising:
   a. a III-V semiconductor substrate;
   b. a continuous thin film contact layer upon that substrate, wherein the contact layer is comprised of a graded intermetallic mixture of at least one rare-earth component selected from the group including the rare-earth series, scandium and yttrium and a non-rare earth component consisting of at least one Group IIIa metal selected from the group including Al, In, Tl;
   c. whereby the contact layer is intermixed with the substrate.

2. The semiconductor device as claimed in claim 1 further comprising a continuous alloy layer upon the contact layer, wherein the alloy layer is comprised of an intermetallic mixture of at least one rare-earth component selected from the group including the rare-earth series, scandium and yttrium, and a non-rare-earth component consisting of at least one Group IIIa, a metal selected from the group including Al, In, and Tl.

3. The semiconductor device as claimed in claim 2 further comprising a continuous cover layer upon the alloy layer wherein the cover layer is comprised of a non-reactive metal such as aluminum, thereby preventing contamination of the contact layer or the alloy layer.

4. The semiconductor device of claim 1 wherein a dopant is present in the contact layer in amounts less than or equal to 5 mole percent of the total contact layer for tailoring the electrical properties of the device.

5. The semiconductor device of claim 1 wherein a surface wetting agent is present in the contact layer in amounts less than or equal to 5 mole percent of the total contact layer for improving the surface uniformity of the contact layer.

6. The device of claim 1 wherein the III-V type semiconductor is gallium arsenide.

7. The semiconductor device of claim 1 wherein the mole fraction of the rare earth component is between 10 to 90 mole percent.

8. The semiconductor device of claim 1 wherein the mole fraction of the non-rare-earth component is between 10 to 90 mole percent.

* * * * *